United States Patent [19]
Popov

[11] Patent Number: 4,952,273
[45] Date of Patent: Aug. 28, 1990

[54] PLASMA GENERATION IN ELECTRON CYCLOTRON RESONANCE

[75] Inventor: Oleg A. Popov, Franklin, Mass.

[73] Assignee: Microscience, Inc., Norwell, Mass.

[21] Appl. No.: 247,416

[22] Filed: Sep. 21, 1988

[51] Int. Cl.$^5$ .................. H01J 27/00; B44C 1/22; B05D 3/06; C23C 14/00

[52] U.S. Cl. .................. 156/643; 118/50.1; 118/623; 118/720; 156/345; 156/646; 204/298.16; 250/424

[58] Field of Search .................. 156/345, 643, 646; 204/192.32, 192.35, 192.37, 298; 118/720, 729, 50.1, 620, 623; 427/38, 39; 250/396 ML, 423 R, 423 F, 424; 315/39, 111.41, 111.81; 313/153, 154, 156, 161, 230, 231.31; 219/121.3, 121.55, 121.58

[56] References Cited

U.S. PATENT DOCUMENTS

| | | | |
|---|---|---|---|
| 4,058,748 | 11/1977 | Sakudo et al. | 313/156 |
| 4,393,333 | 7/1983 | Sakudo et al. | 315/111.81 |
| 4,409,520 | 10/1983 | Koike et al. | 315/39 |
| 4,450,031 | 5/1984 | Ono et al. | 156/345 |
| 4,462,863 | 7/1984 | Nishimatsu et al. | 156/643 |
| 4,609,428 | 9/1986 | Fujimura | 156/643 |
| 4,610,770 | 9/1986 | Saito et al. | 204/192.1 |
| 4,769,101 | 9/1988 | Ribeiro | 156/646 X |
| 4,778,561 | 10/1988 | Ghanbari | 156/345 X |

OTHER PUBLICATIONS

"ECR Plasma CVD Process", Extended Abstracts of the 16th (1984 International) Conference on Solid State Devices and Materials, Kobe, 1984, pp. 459–462.
Suzuki et al., "Microwave Plasma Etching", Vacuum, vol. 34, No. 10/11, pp. 953–957, 1984.
Miyake et al., "Microwave Plasma Stream Transport System for Low Temperature Plasma Oxidation", J. Vac. Sci. Tech., A., vol. 2, No. 2, pp. 496–499, Apr.–Jun., 1984.
Matsuo et al., "Low Temperature Chemical Vapor Deposition Method Utilizing an Electron Cyclotron Resonance Plasma", Japan J. of Appl. Phys., vol. 22, L. 210–212.
Ono et al., "Reactive Ion Stream Etching Utilizing Electron Cyclotron Resonance Plasma", J. Vac. Sci. Tech. B 4(3), May, Jun. 1986, pp. 696–700.
Miller et al., "Experiments with an Electron Cyclotron Resonance Plasma Accelerator", AIAA Journal, vol. 2, No. 1, Jan. 1964, pp. 35–41.
Miller et al., "Cyclotron Resonance Thruster Design Techniques," AIAA Journal, vol. 4, No. 5, May 1986, pp. 835–840.
Sercel, "Electron-Cyclotron-Resonance (ECR) Plasma Thruster Research", AIAA/ASME/SAE/A-SEE 24th Propulsion Conference, Jul. 1988.

(List continued on next page.)

Primary Examiner—William A. Powell
Attorney, Agent, or Firm—Fish & Richardson

[57] ABSTRACT

Electron cyclotron resonance (ECR) is achieved in a source chamber of a size which is non-resonant with respect to propagation of the microwave power within the chamber. The microwaves are delivered into the chamber via a waveguide and window so that breakdown occurs initially only in a region in the vicinity of the window. A dielectric coupler between the waveguide and the window has a larger end and a smaller end and is filled with a dielectric material. The magnetic field generator for stimulation the electron resonance in the chamber includes a pair of conductive current carrying coils coaxial with each other and with an axis of the chamber, the coils being arranged in a Helmholtz configuration. The waveguide includes a microwave stub tuner for tuning the propagation and absorption of the microwave power in the plasma within the chamber to control the location and shape of the region in which the plasma is formed. A conduit provides a path for delivery of the plasma from one end of the chamber and is sized to be non-resonant with respect to propagation of the microwave energy. The magnetic field is controlled to cause the formation of the plasma with high absorption of microwave power occurring substantially within a columnar region centered on an axis of the chamber. The chamber has an insulative lining.

35 Claims, 21 Drawing Sheets

OTHER PUBLICATIONS

Tokiguichi et al., "Beam Extraction Experiments from Microwave Ion Sources", Rev. Sci. Instrum., 57(8), Aug. 1986, pp. 1526–1530.

Torii et al., "Very High Current ECR Ion Source for An Oxygen Ion Implanter", Nucl. Instr. Methods, Phys. Res., B21 (1987).

Tobinaga et al., "Anisotrophy of Low-Energy Ion Etching Via Electron Cyclotron Resonance Plasma," J. Vac. Sci. Tech., B. vol. 6(1), Jan.–Feb. 1988.

Yamada et al., "Low Temperature Film Formation By Reactive Ion Beam Deposition", ISIAT '85, 9th Symposium, Ion Sources and Ion-Assisted Technology, Jun. 3–5, 1985.

Kawarada et al., "Large Area Chemical Vapour Deposition of Diamond Particles and Films Using Magneto-Microwave Plasma," Japan J. Appl. Phys., vol. 26, No. 6, Jun. 1987, pp. L1032–1034.

Matsuo et al., "Reactive Ion Beam Etching Using a Broad Beam ECR Ion Source", Japan J. of Appl. Physics, vol. 21, No. 1, Jan. 1982, pp. L4–L6.

Chen Keqiang et al., "Microwave Electron Cyclotron Resonance Plasma for Chemical Vapor Deposition and Etching," J. Vac. Sci. Tech., A., vol. 4.

Asakawa et al., "Optical Emission Spectrum of $Cl_2$ ECR Plasma in the GaAs Reactive Ion Beam Etching (RIBE) System," Jap. J. of Appl. Physics, vol. 23, No. 3, Mar. 1984, pp. L156–L158.

Tokiguichi et al., "Plasma Uniformity of Microwave Ion Sources", J. Vac. Sci. Tech., vol. 17, No. 5, Sep.-/Oct. 1980.

Mejia et al., "Electron-Cyclotron-Resonant Microwave Plasma System for Thin-Film Deposition", Rev. Sci. Instrum., 57(3), Mar. 1986.

Ishikawa et al., "Axial Magnetic Field Extraction-Type Microwave Ion Source with a Permanent Magnet," Rev. Sci. Instrum. 55(4), Apr. 1984, pp. 449–456.

Plasma Technology, U.K. North End, 1986.

Mitsubishi Literature, ECR 3000R, Plasma Technology.

ECR Literature, "Sumitomo Metal Industries."

ASTEX, Applied Science and Technology, Inc., 5/16/87.

$N_2$
$\phi_s = 6''$
$P = 5 \times 10^{-4}$ Torr
$P_{inc} = 900W$
$P_{ref} = 21W$
$I_1 = 125A$
$I_2 = 123A$ $N_2$
$\phi_s = 6''$
$P = 5 \times 10^{-4}$ Torr
$P_{inc} = 900W$
$P_{ref} = 73W$
$I_1 = 125A$
$I_2 = 130A$ $P_i = 700W$
$P_r = 73W$
$I_1 = 120A$
$I_2 = 115A$ $P_i = 700W$
$P_r = 93W$
$I_1 = 120A$
$I_2 = 138A$

PLASMA GENERATION IN ELECTRON CYCLOTRON RESONANCE

BACKGROUND OF THE INVENTION

This invention relates to plasma generation by electron cyclotron resonance (ECR).

In ECR, energy from the electric field of microwave radiation is absorbed by electrons of a selected gas within an evacuated source chamber, causing the gas to ionize. A magnetic field established within the chamber causes the electrons to traverse circular orbits in the manner of a cyclotron. The electrons collide with and ionize other gas molecules to form the plasma. If the magnetic field matches the microwave frequency (e.g., 875 Gauss for a microwave frequency of 2.45 GHz), the orbital frequency of the electrons is resonant with the microwave frequency. Then the electrons absorb microwave energy very efficiently, producing high electron and high ion densities, at relatively low microwave power.

ECR generated plasma streams are useful, for example, in low energy ion beam etching and thin film processes.

SUMMARY OF THE INVENTION

The invention enables the ECR generation of high density plasmas with high absorption of microwave power and controllable plasma properties. The general aspects of the invention include the following.

In one aspect, the chamber is of a size which is non-resonant with respect to propagation of the microwave power (delivered via a window) within the chamber, thus enabling the source to be compact for applications in which only a small space is available.

In another aspect, the microwaves are delivered via a waveguide and window whose configurations are chosen with respect to a mode of propagation of the microwave power so that delivery of microwave power into the chamber and breakdown (development of a self-sustained plasma) both occur initially only in a region in the vicinity of the window and in the presence of a magnetic field (e.g., 875 Gauss). This allows initial breakdown to be achieved even in chambers which are non-resonant and without requiring propagation of microwave power in the chamber. In preferred embodiments, the transmitted power ($P_t = P_{inc} - P_{ref}$) in initial breakdown is no more than 40 watts.

In another aspect, the waveguide is of larger cross-section than the chamber, and there is a dielectric coupler between the waveguide and the window; the coupler has a larger end for coupling to the waveguide, a smaller end for coupling to the window, and a dielectric material between the two ends; the ratio of the dimensions of the larger end, $\phi_0$, to the smaller end, $\phi_\epsilon$, is $\sqrt{\epsilon}$, where $\epsilon$ is the dielectric constant of the dielectric material; and every cross-sectional width of the larger end is larger than any cross-sectional width of the smaller end. Preferred embodiments include the following features. The dielectric coupler has a metal wall, is not evacuated and has a length which is exactly an integral number of half wavelengths of the microwave power. The window is supported in a flange and the magnetic field generator surrounds the chamber and is larger than the flange but smaller than the large end of the dielectric coupler.

In another aspect, the magnetic field generator for stimulating the electron resonance in the chamber includes a pair of conductive current carrying rings coaxial with each other and with an axis of the chamber, the rings being arranged in a Helmholtz configuration to achieve uniform fields within the chamber. In preferred embodiments, the magnetic field generator is movable along the length of the chamber.

In another aspect, the waveguide includes a microwave stub tuner for tuning the propagation of electromagnetic waves from the microwave source to the plasma within the chamber to control the location and shape of the region in which the plasma is formed. Preferred embodiments include the following features. The microwave tuner is tuned to achieve either a cylindrical or ring shaped plasma formation region centered on an axis of the chamber, or a generally continuous plasma formation region across the width of the chamber with a predetermined magnetic field strength (e.g., 930–940 Gauss) being established in the vicinity of the window.

In another aspect, a conduit provides a path for delivery of plasma from an end of the chamber and is sized to be non-resonant with respect to propagation of the microwave power In preferred embodiments, the conduit is shorter than its width; in other embodiments, the conduit is longer than its width. A second separate magnetic field generator generates a magnetic field (e.g., a relatively small field) within the conduit. A microwave tuner may be adjusted to cause the formation of plasma within or near the input end of the conduit. The distance from a work surface to an end of the conduit (or chamber in the absence of a conduit) is controllably adjusted to achieve a desired plasma density at the work surface. The conduit enables delivery of a plasma stream of desired characteristics to a work surface; and enables a pressure differential between the region where the work surface is located and the source chamber.

In another aspect, the magnetic field is controlled to cause the formation of the plasma, with high absorption of microwave power occurring substantially within a columnar or ring-shaped region centered on an axis of the chamber.

In another aspect, the chamber has an insulative lining whereby the plasma may be delivered to the work surface free of current, enabling the work surface to be held at ground potential or floating potential without disturbing the plasma characteristics.

Preferred embodiments include the following features. The magnetic field generator is movable along the length of the chamber and is tunable to provide selectively constant and gradient magnetic fields along the length of the chamber. The chamber is smaller than 2" in diameter.

Other advantages and features will become apparent from the following description of the preferred embodiment and from the claims.

DESCRIPTION OF THE PREFERRED EMBODIMENT

We first briefly describe the drawings.

Structure

Figure 1:
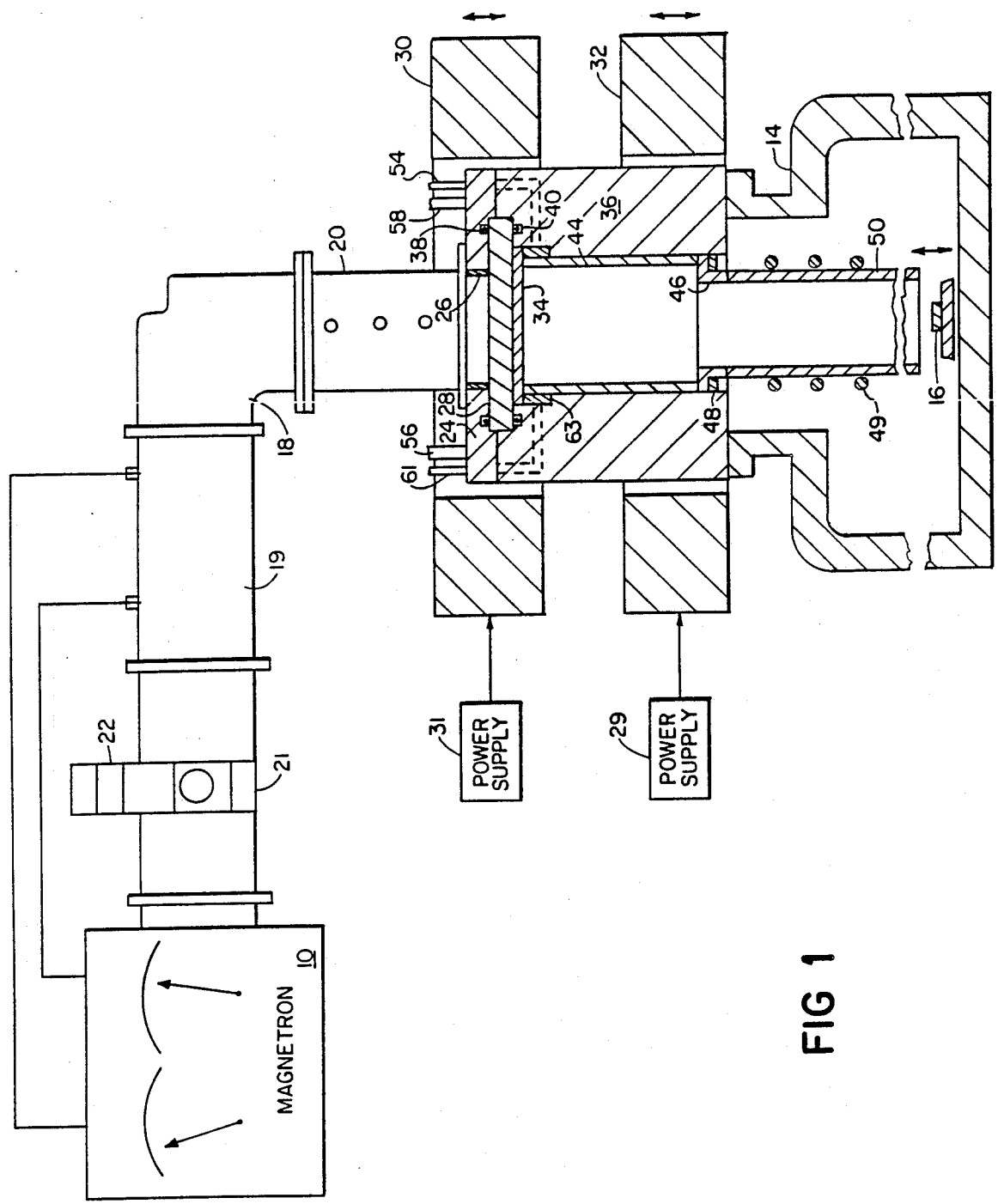
FIG. 1 is a side view, partly in section and partly broken away, of an ECR plasma system.

Referring to FIG. 1, to provide energy for the production of a plasma, microwaves are generated by a continuous wave magnetron 10, at a frequency of 2.45 GHz, with plus or minus 1% variance. The forward power can be continuously varied from 10 to 1,000 watts.

The plasma is generated in a source chamber 12 mounted on a stainless steel vacuum chamber 14 which contains a sample 16 onto which a stream of the plasma is to be directed. Magnetron 10 is connected by a transmission line (waveguide) 18 to a three-stub tuner 20 (2.84 cm × 1.32 cm), which leads through a hole 26 in flange 24 to source chamber 12. The incident and reflected power are measured with a directional coupler 19 mounted in the transmission line. To protect the magnetron 10 from reflected power, a three-port circulator 21 with a dummy load 22 is also installed in the transmission line.

The microwave energy is introduced into the source chamber 12 via a quartz vacuum window 28, which has an appropriate diameter and thickness to operate as a ¼ wavelength matching element in the microwave circuit.

Surrounding the source are two round magnetic coils 30 and 32. The coils are configured to be able to produce a range of magnetic field strengths, including 875 Gauss, within the source 12. The two coils can generate either an axially uniform field or a field of desired gradient along the length of the source chamber, depending on relative currents applied to them by separate power supplies 29, 31. The coils are spaced in a Helmholtz configuration, i.e., the distance between the coils 30 and 32 is the same as the radius of each coil. The two coils can be moved axially by a mechanism not shown in order to adjust their spacing and their position along the length of the chamber to control the location of the high absorption region within the chamber.

A window shield 34 may be used to prevent heat damage to the window 28. Shield 34 is a non-critical element in the microwave circuit, as its thickness is less than ⅛ of the window thickness.

The source chamber 12 is enclosed by a non-magnetic stainless steel body 36. 0-rings 38 and 40 seal flange 24, source body 36, and window 28. (Only ring 40 is needed for non-ultra-high vacuum operation.)

The diameter of the source chamber 12 may be any appropriate size, for example, in the range of 1" to 8", and is not limited by microwave propagation considerations. A four inch diameter chamber is close to resonant for the first cylindrical mode $TE_{III}$ for 2.45 GHz microwaves. The cutoff diameter is 2.83 inches, below which the microwaves generally will not propagate in the chamber 12.

An insulation shield 44 (e.q., quartz, boron nitride, or alumina) lodged within the source body 36 protects the plasma from interaction with the source body 36 and provides a stable direct current electric field gradient to exist along the length of the inner wall of the source chamber 12. No current exists through the ECR plasma between the sample and the shield. Without shield 44, uneven plasma product insulative deposition on the stainless steel would yield unstable electric field gradients.

A protective shield 46 sits below shield 44 to protect a limiter 48 from the plasma. Limiter 48 supports a tube 50, controls the diameter of the plasma stream, and provides, when needed, grounding of the plasma (in which case the shield 46 is removed). Grounding is needed when the sample is required to be negatively or positively biased.

A 14" to 18" long tube 50 is attached to protective shield 46. The tube material (conductive or non-conductive) is chosen to be compatible with the particular plasma being generated and with the process in which the plasma is being used. The vacuum pressure at sample 16 may be an order of magnitude lower than at the source chamber, thus permitting differential pumping of the source and the sample. Among the functions of the tube are to control, by its dimension, the size, shape, and density of the plasma stream at the sample, and to deliver the plasma to the sample without interfering with adjacent equipment. Tube 50 may be surrounded by coils 49 to provide a plasma confining magnetic field with the tube. Sample 16 may be moved up and down relative to tube 50 to control the plasma parameters (e.g., density, electron temperature).

Input and output ports 54, 56 are provided for water cooling of the chamber body. The cooling water is isolated from of the vacuum chamber to prevent water leakage; no welded sites are exposed to the plasma. The gas used to form the plasma is injected into the source chamber via input and output gas lines 58, 61 which feed a distributor ring 63 that has a number of evenly spaced small holes. The gas seeps through the holes to the outer wall of shield 44 and then through the gap between shield 44 and shield 34. Thus no inlet holes are exposed within the chamber and shield 44 can be easily fabricated without special holes.

Magnetic coils 30, 32 are typically located so that the uniform field they generate begins near the vacuum window and exists along the source chamber for a length of 3". Although the field is also generally uniform radially, at distances greater than 3" from the axis there is a small increase of magnetic field close to the chamber walls.

Operation

As explained below, high-density plasmas may be generated efficiently within source chamber 12 by, e.q., adjustment of the level of the incident microwave power; adjustment of the microwave stub tuner; control of the pressure of the gas; and adjustment of the applied magnetic fields.

The plasmas can be generated efficiently in both resonant-size chambers (i.e., chambers sized for the fundamental transmission modes of the microwave source frequency of 2.45 GHz) and in smaller or larger non-resonant chambers.

Plasma generation proceeds in two stages. The first, breakdown, produces a relatively low density plasma (with a substantial part of the incident power being reflected and transmitted). The second, high absorption, is characterized by a sharp increase in power absorption (and decrease in transmitted and reflected power to a negligible level) and results in a high density plasma.

In general, with the plasma source system of FIG. 1, ECR plasmas have been generated, at pressures of $10^{-5}$ to $10^{-2}$ torr, at a net microwave transmitted power reaching the chamber as low as 10 to 20 watts in both resonant and non resonant sized chambers. The initial breakdown occurs at discreet sites, generally at the locations where the magnetic field corresponds to the microwave frequency, i.e., 875 Gauss. In source chambers with diameters at least as large as the cutoff dimension initial breakdown occurs at three distinct sites along the chamber as well as off axis (as explained below). In source chambers with diameters smaller than the cutoff dimension, breakdown occurs at a single site (as explained below) within a few millimeters of the inside surface of vacuum window 28. For both small and large chambers, high absorption can occur over a wide range of absorbed power, from a few tens of watts to a few hundred watts depending on the size of the source, the gas pressure, and the magnetic field configuration.

The ECR plasma formed as a result of breakdown may be radially uniform but may have other configurations depending on microwave tuning and tuning of the magnetic field configuration.

Figure 2:
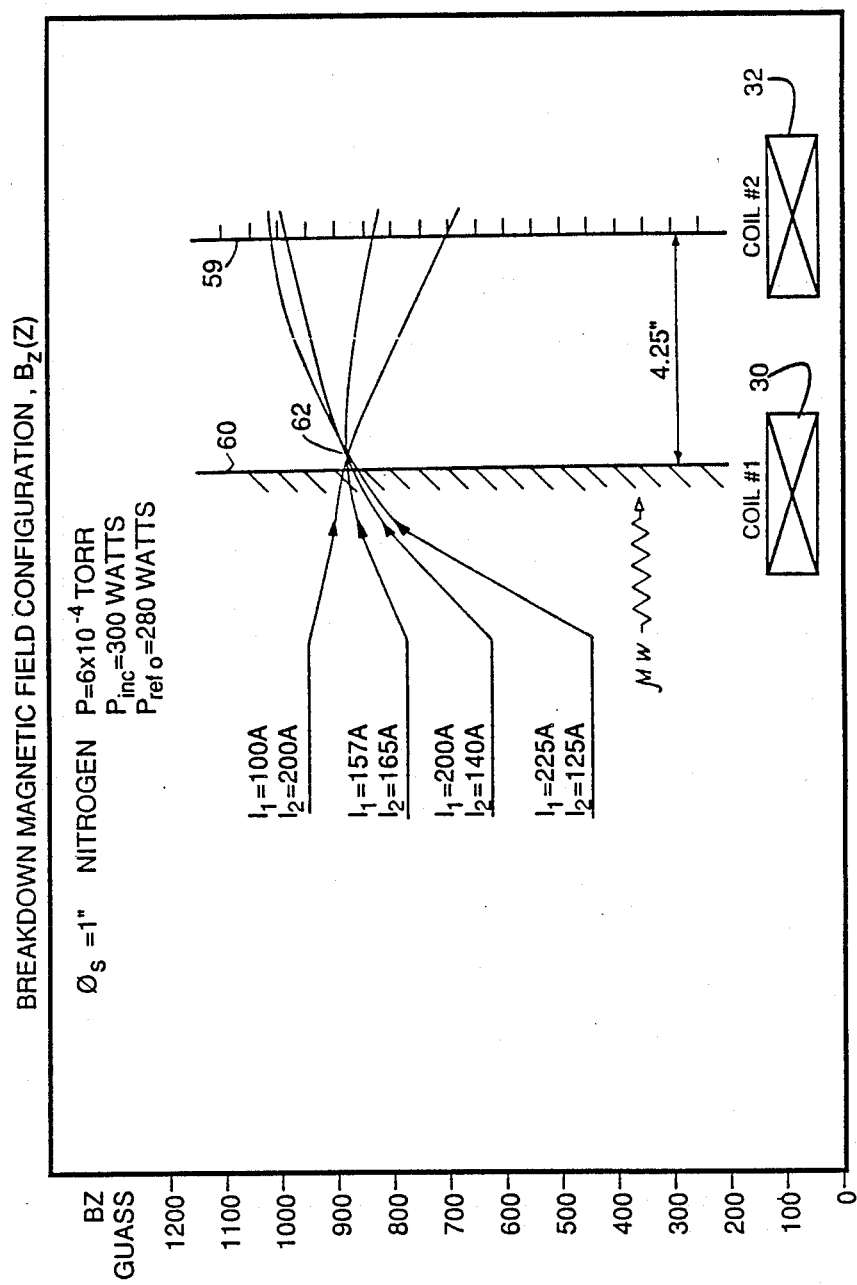
FIG. 2 is a graph illustrating the location of initial breakdown.

More specifically, referring to FIG. 2, with the end of the source 59 placed at an axial distance of about 4.25" from the inner surface 60 of the vacuum window 28 in a 1" diameter source chamber, it is possible to determine that breakdown occurs at a location 62 just inside vacuum window 60 by observing that different combinations of currents in coils 30, 32 ($I_2$ and $I_1$, respectively) produce magnetic field gradients which all intersect the 875 Gauss level at location 62. Thus, even in a chamber having a smaller than cutoff diameter, a small but sufficient level of microwave power reaches a region just inside the vacuum window to cause breakdown.

Figure 3:
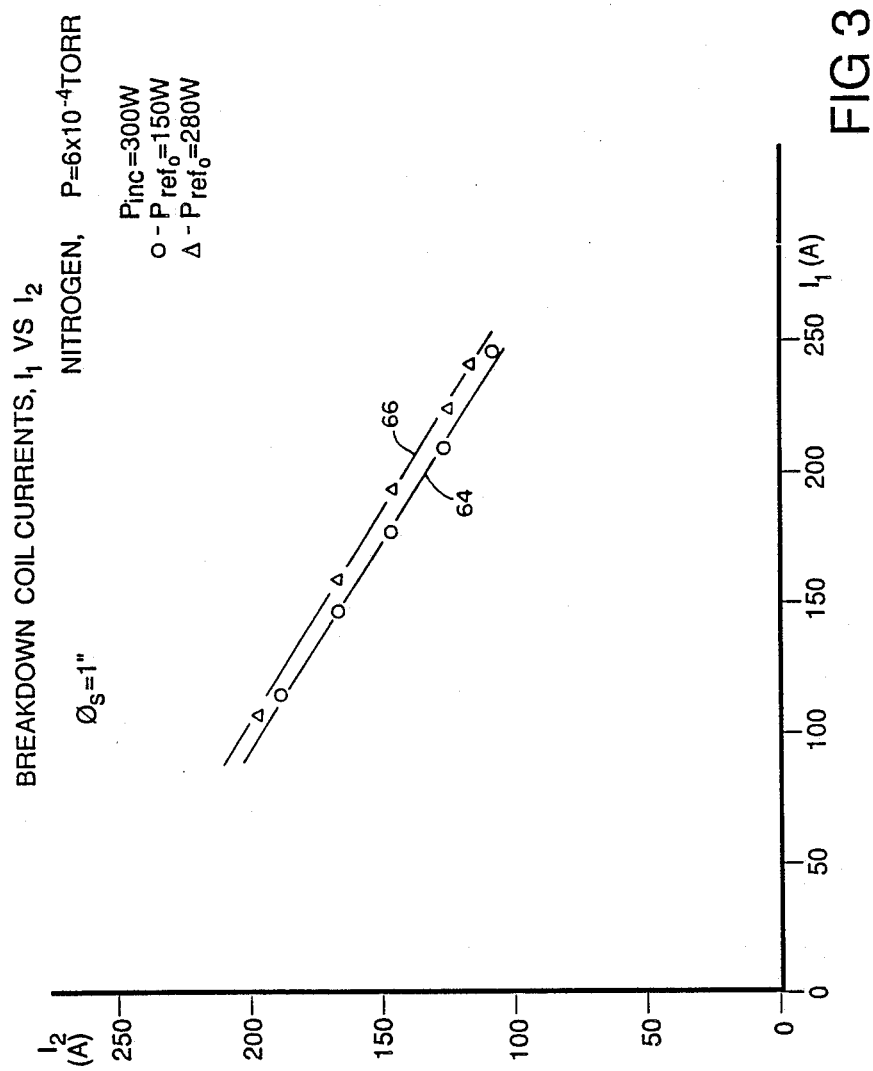
FIG. 3 is a graph illustrating the effect of stub tuner adjustment on propagated power needed for initial breakdown.

Referring to FIG. 3, it can be seen that by adjusting the stub tuner from one setting to another, the reflected power can be reduced substantially and the efficiency of breakdown enhanced, from 280 watts (curve 66) to 150 watts (curve 64). Note that curve 66 corresponds to the same conditions as in FIG. 2. Note that the slopes of the curves 64, 66 are the same, indicating that breakdown occurs at the same site.

Figure 4:
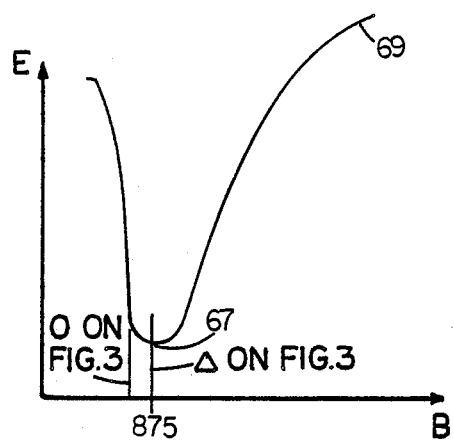
FIG. 4 is a graph showing the sensitivity of the minimum electric field for initial breakdown to changes in the axial magnetic field

Referring to FIG. 4, the 875 Gauss magnetic field value represents a minimum 67 along curve 69 in the electric field E required for breakdown. This corresponds to minimum transmitted power $P_t = P_{inc} - P_{ref}$. For field values slightly higher or lower than 875 Gauss, a substantial increase in transmitted power (decrease of reflected power) is required, as seen in FIG. 3.

Figure 5:
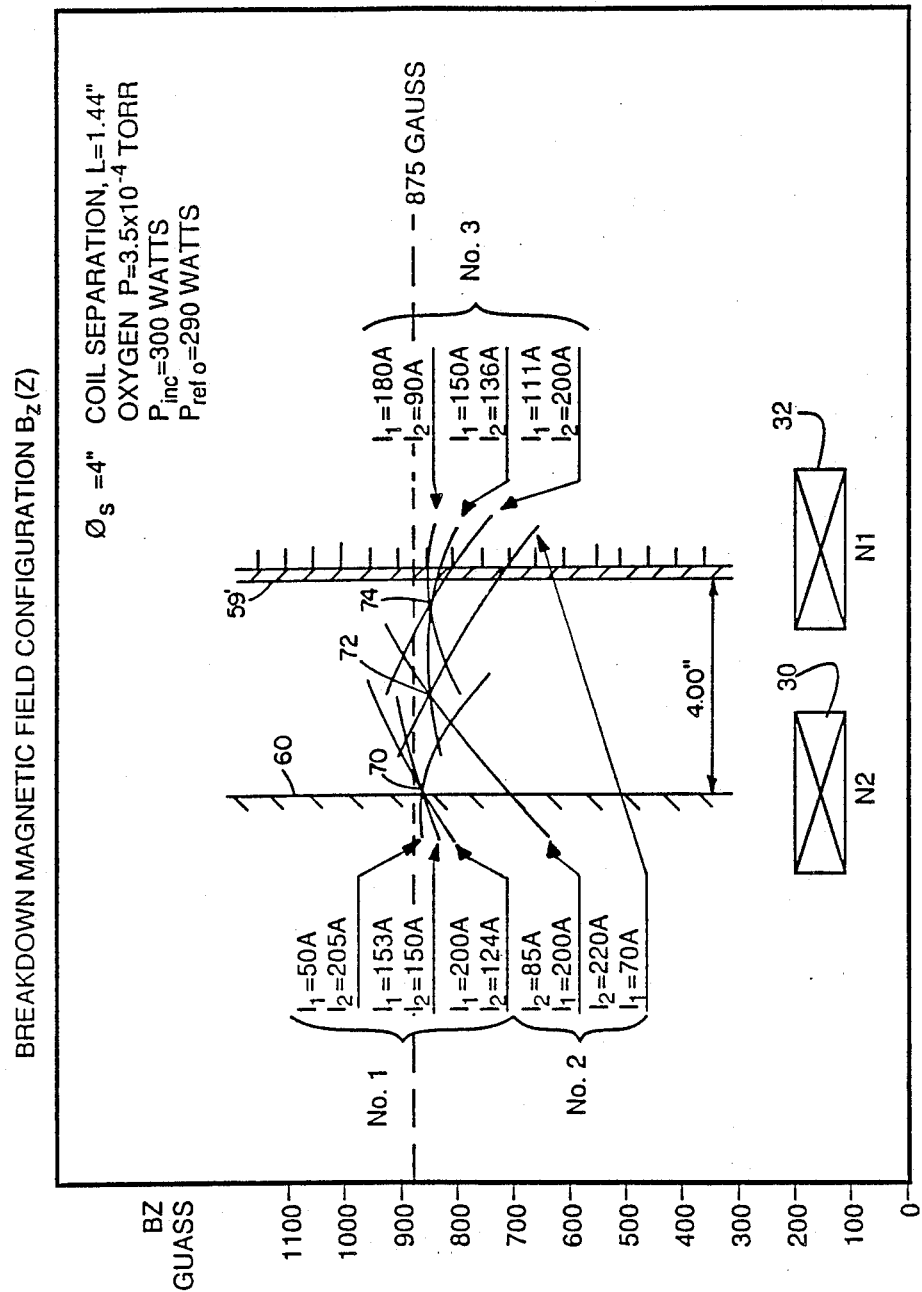
FIG. 5 is a graph illustrating the locations of initial breakdown in a larger chamber.

Referring to FIG. 5, for a 4" diameter source chamber, with a grid 591 placed about 4.00" (chamber size is close to resonant) from the inner surface 60 of vacuum window 28, first stage breakdown occurs at three locations 70, 72, 74 along the length of the source chamber (but not on the axis) where the magnetic field configurations generated by different current settings intersect. In each case, the magnetic field at the breakdown location is shown on FIG. 5 to be somewhat less than 875 Gauss at the axis. This reflects the fact that breakdown is actually occurring away from the axis at a point where the field is 875 Gauss. (For sources with diameter larger than 1/3 the diameter of the magnetic coils, there is a slight increase in the magnetic field near the chamber wall which grows with source diameter).

Figure 6:
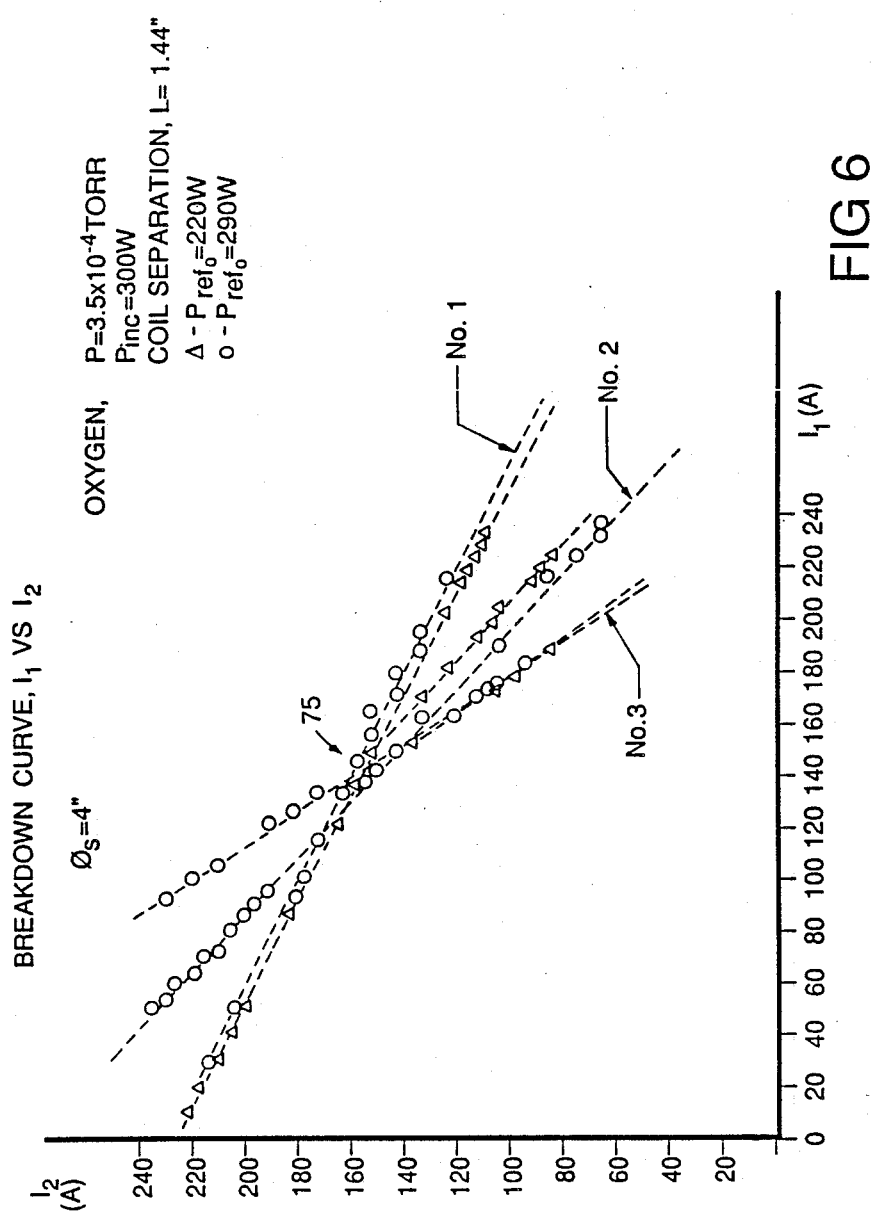
FIG. 6 is a graph illustrating the effect of microwave tuner adjustment on the locations of initial breakdown of FIG. 5.

FIG. 6 illustrates that for the 4" source of FIG. 5, as for a 1" source, microwave tuning with three stubs results in a substantial increase in reflected power, from 220 watts to 290 watts. The curves marked No. 1, 2, and 3 correspond to the three locations of breakdown 70, 72, 74 in FIG. 5. Breakdown can be achieved simultaneously at all three locations by operating in region 75 because the magnetic field has no gradient along the source axis for coil currents corresponding to region 75. (Note that a constant slope line on FIG. 6 corresponds to a fixed location along the length of the chamber.)

Thus even in chambers with diameters smaller than cutoff, enough microwave energy penetrates to a point just inside the vacuum window to cause breakdown (FIG. 2), while microwave energy propagates in a larger-than cutoff-diameter source chambers to permit breakdown at locations distant from the inside surface of the vacuum window (FIG. 5).

Occurrence of high absorption of microwave power, characterized by a sharp increase in absorbed power (corresponding to sharply reduced reflected power and transmitted power through the plasma) and an increase in plasma density, can be caused by increasing the gas pressure, adjusting the magnetic field, adjusting the microwave tuner, or increasing the microwave power.

High absorption generally can occur when plasma density is at least $7.4 \times 10^{10}$ cm$^{-3}$, in a magnetic field region of about 875 Gauss, and with microwave power propagated to the site of high absorption.

Within the chamber, the region in which high absorption occurs can be observed as a region of high brightness and high plasma density and may be donut-shaped of various diameters (depending on pressure and magnetic field configurations), and centered on the source chamber axis, or a bright spot or cylindrical column (also centered on the axis), or spread throughout the chamber (in the presence of high magnetic field). In the case of a column, its diameter varies from 1 to 12 cm, depending on the gas pressure and the microwave power absorption.

Figure 7:
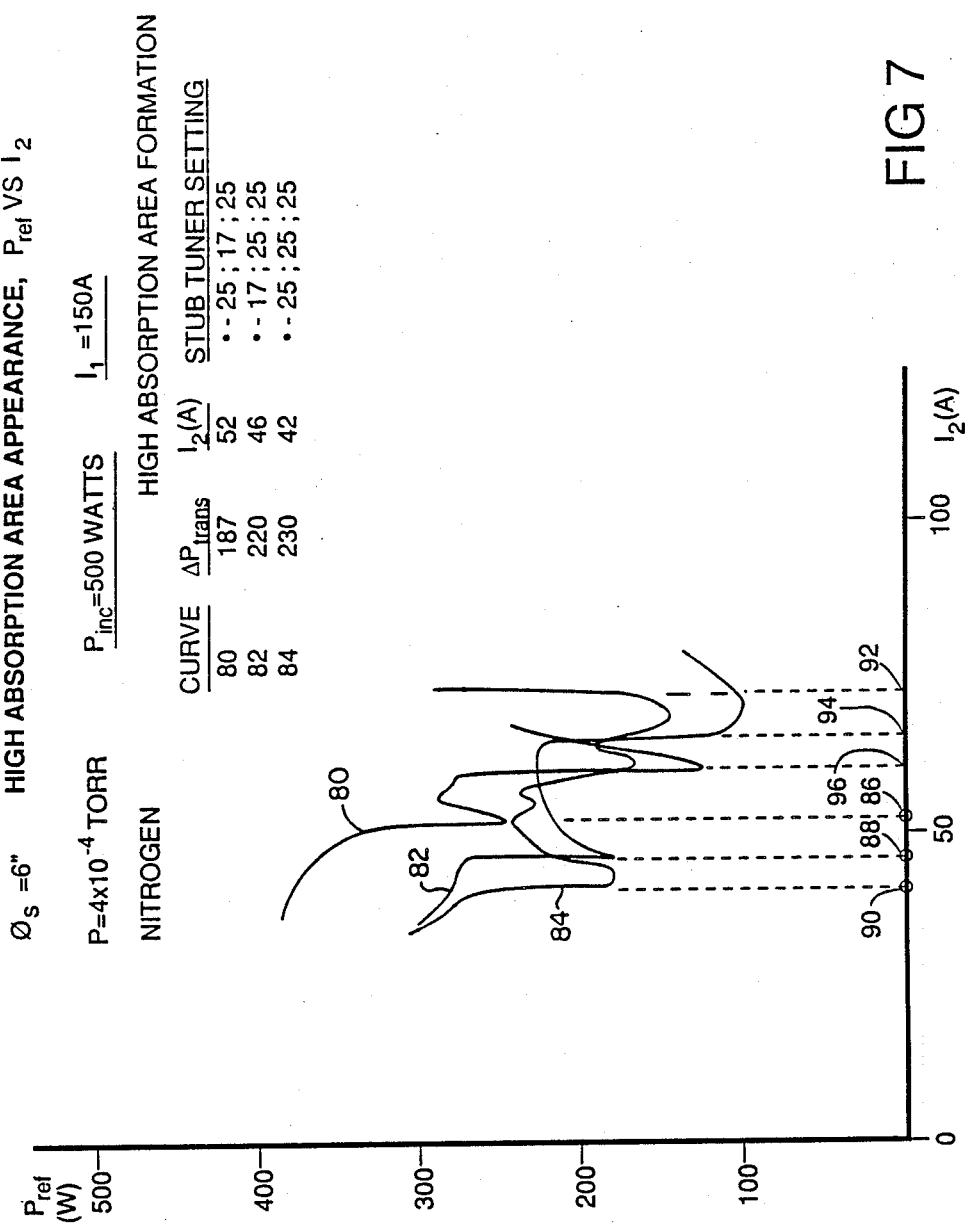
FIG. 7 is a graph illustrating occurrences of high absorption for different stub tuner adjustments.

Referring to FIG. 7, for a 6" diameter source chamber without a grid, high absorption can be achieved by appropriate adjustments of the magnetic field and/or the three stub tuner. The three curves 80, 82, 84 of FIG. 7 correspond to three different settings of the three-stub tuner. In each case, $I_1$ was set at 150 A and $I_2$ was varied (thus shifting the axial position of the 875 Gauss magnetic field). After breakdown was achieved $I_2$ was increased. At some value of the current $I_2$, a magnetic field configuration is reached where high absorption occurs (given the temporarily fixed setting of the stub tuner). The high absorption is characterized by a sudden drop in the reflected and transmitted power, i.e., a sudden increase in the absorbed power. (Note that transmitted power is measured by a probe located a few inches downstream of the source.) For the three curves 80, 82, 84, the high absorption occurs at currents 86, 88, 90, respectively. As $I_2$ is increased further, there are third breakdowns at currents 92, 94, 96. Because a change in the $I_2$ setting also represents a movement of the 875 Gauss position along the chamber axis away from the vacuum window, it is apparent that other occurrences of high absorption can occur at different sites along and across the axis of the chamber.

FIG. 7 illustrates that it is possible to adjust the stub tuner to cause high absorption at the different axial sites of high absorption. This is expected because adjusting the stub tuner should have the effect of "focusing" microwave power at different sites along the chamber axis. By adjusting both $I_2$ and the stub tuner, it would be possible to cause high absorption to occur anywhere along the chamber, provided the plasma density was high enough.

Figure 8:
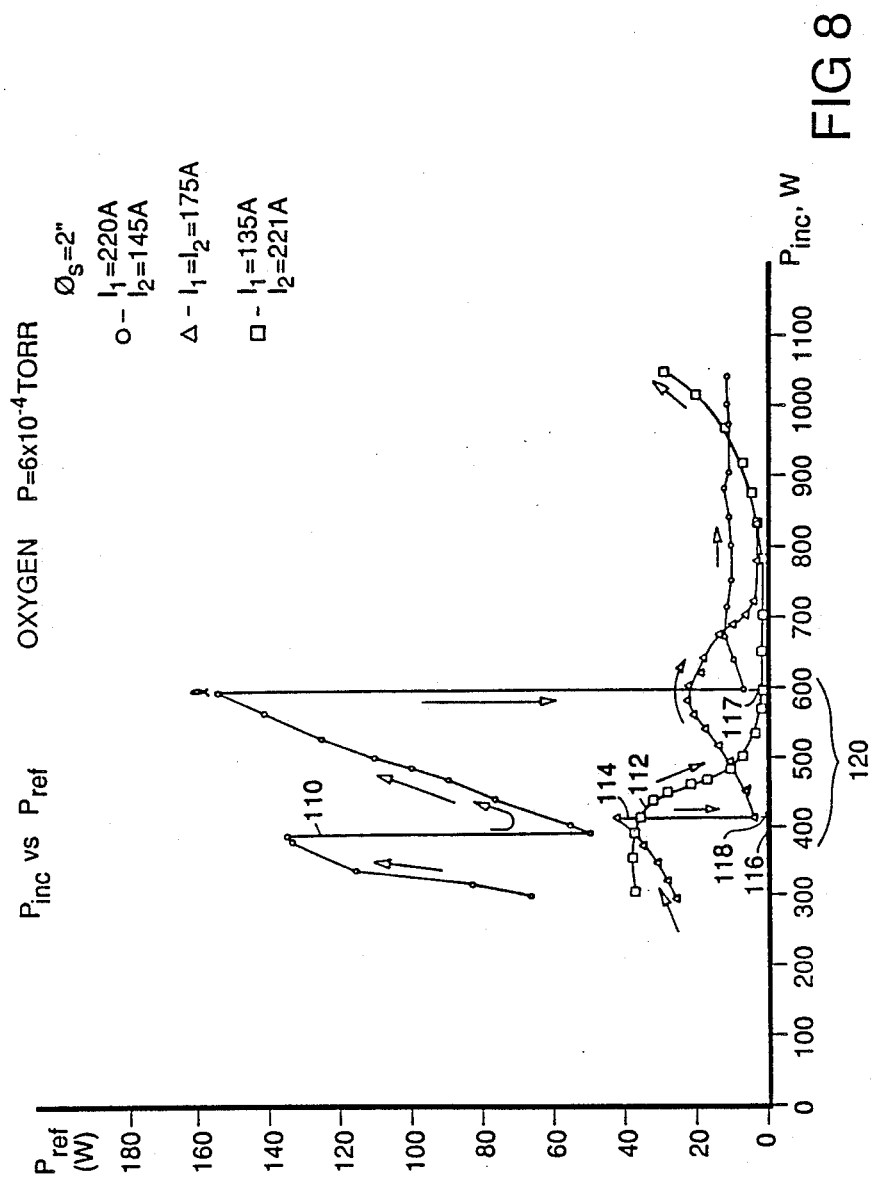
FIG. 8 is a graph illustrating occurrence of high absorption for different magnetic fields.

Hiqh absorption may also be affected by the magnitude of the incident microwave power. FIG. 8 shows this effect for a 2" diameter (smaller than cutoff) source. For three separate current combinations, i.e , magnetic field distributions, represented by the three curves 110, 112, 114, increasing the microwave power will cause high absorption at respectively points 116, 117, 118 for curves 110, 114, and in a region 120 for curve 112.

Figure 23:
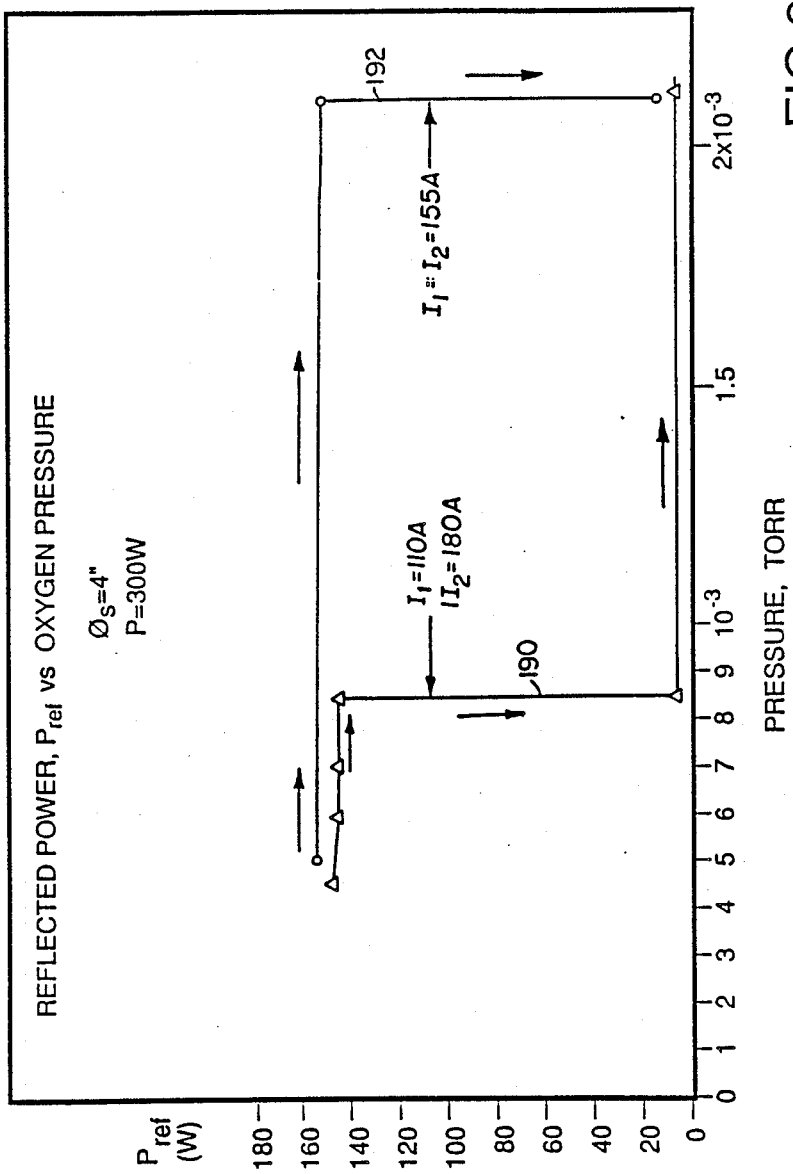
FIG. 23 is a graph of reflected power versus plasma pressure.

Referring to FIG. 23, for two different magnetic field configurations, the high absorption curves 190, 192 indicate that a transition can be triggered by raising the gas pressure.

Figure 9:
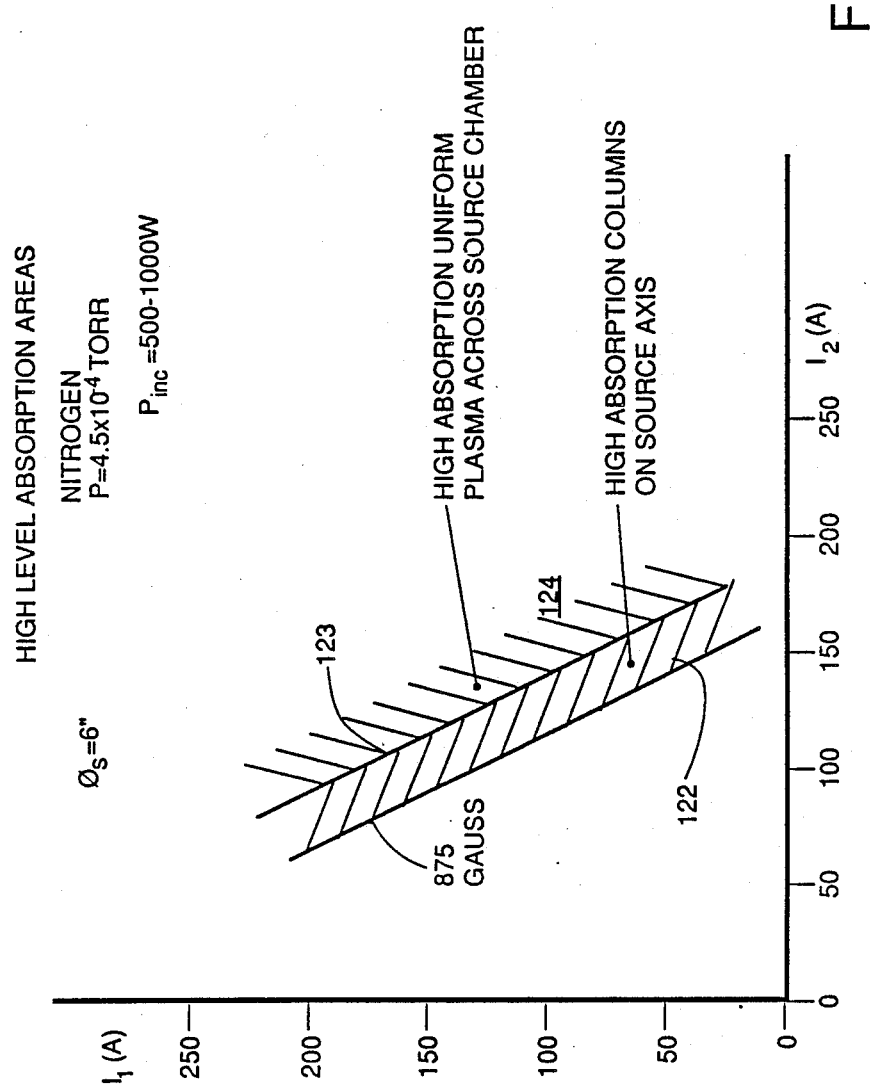
FIG. 9 is a graph illustrating the relationship of magnetic field tuning and two different modes of occurrence of high absorption.

Referring to FIG. 9, for a large source chamber and for a magnetic field corresponding to coil currents in a region 122, a column of high absorption is centered on the source axis. A slight tuning of the magnetic field into a region 124 then results in the appearance of a uniform ECR plasma across the source chamber. Adjustment of the stub tuner in region 124 will produce an increase in plasma density. Curve 123 represents a magnetic field of 930-940 Gauss on the source axis near the vacuum window. High absorption columns of radii 2-3 cm then spread across the source to produce a uniform plasma of diameter 4-5".

Figure 18:
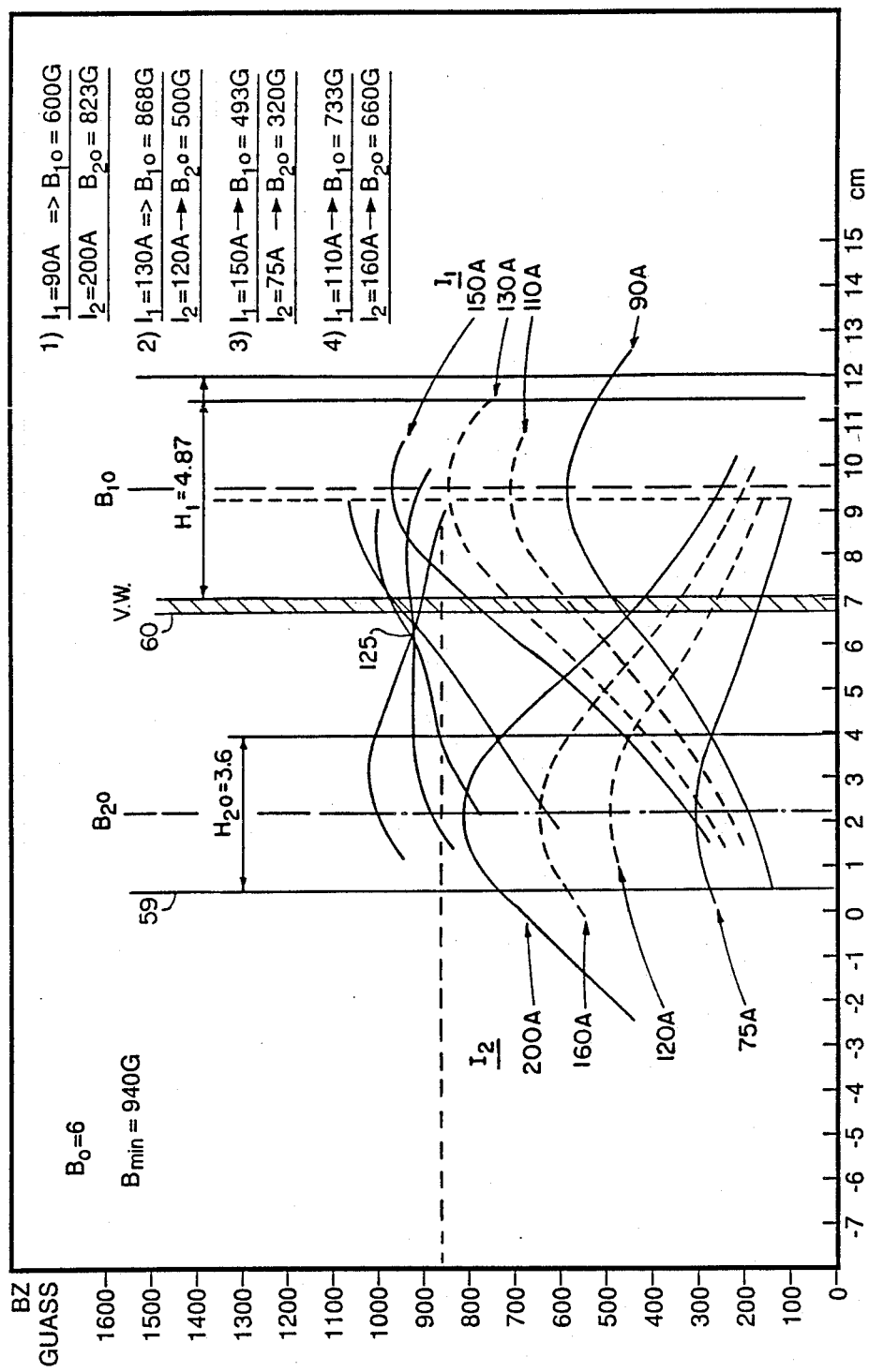
FIG. 18 is a graph illustrating the location of high absorption for various magnetic field gradients
Figure 19:
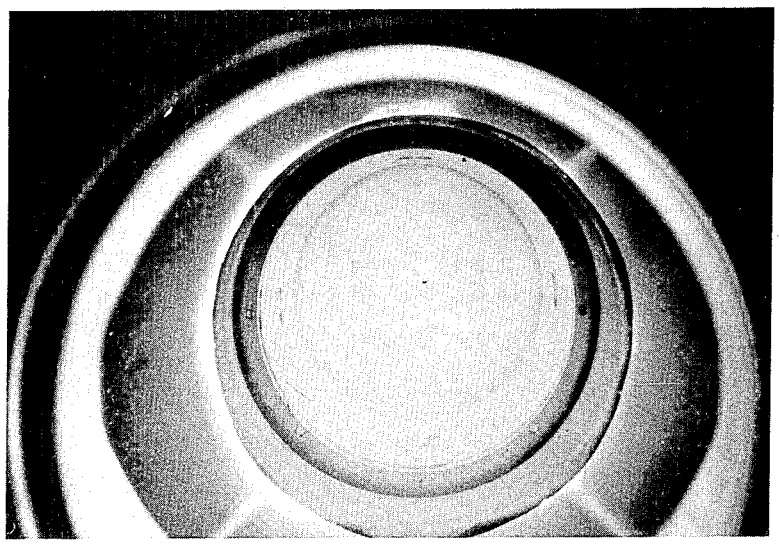
FIGS. 19, 20, 21, 22 are photographs of high absorption patterns in a 6" source under various conditions.
Figure 20:
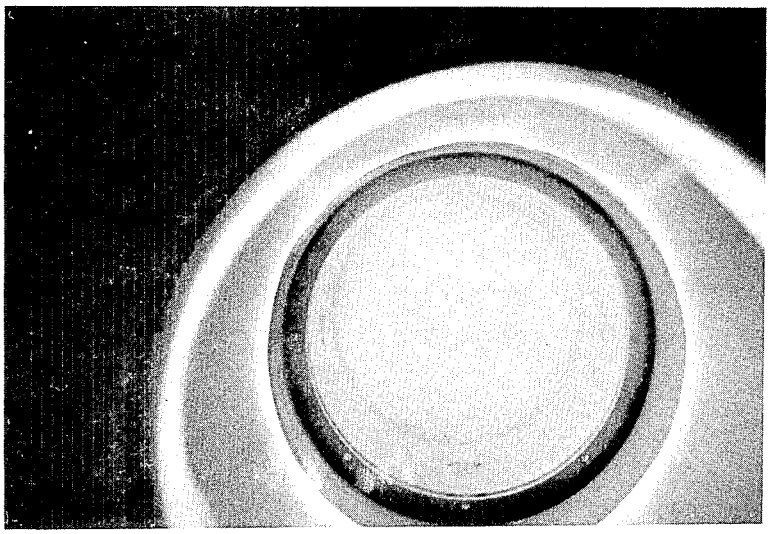
Figure 21:
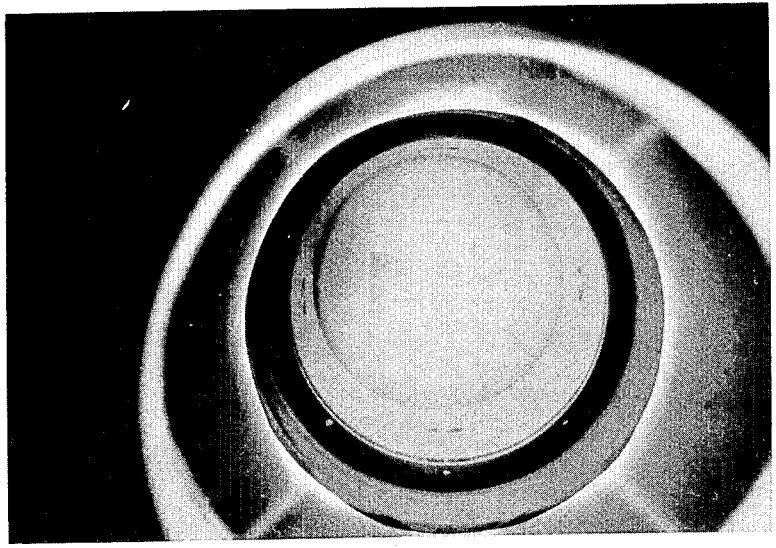
Figure 22:
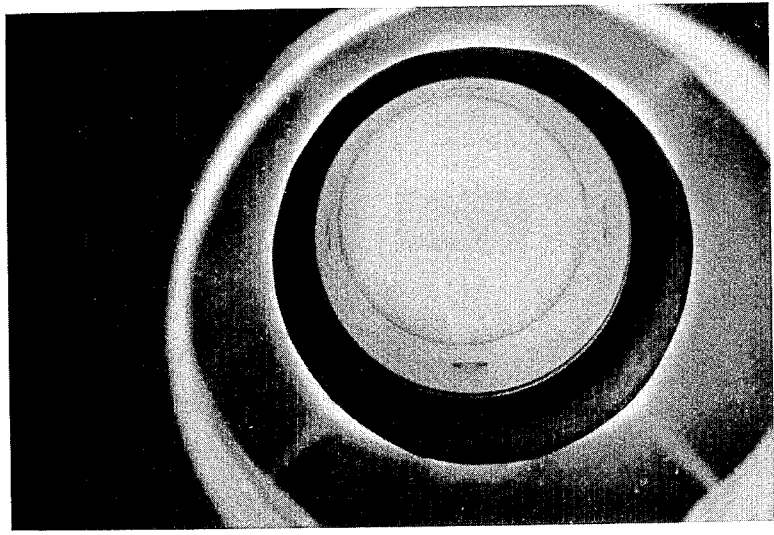

Referring to FIG. 18, all magnetic field lines intersect at region 125, corresponding to 930-940 Gauss at a location just inside the vacuum window 60.

Referring to FIGS. 19, 20, 21, 22, it is possible to see the transition across curve 123 (in FIG. 9) that results from a slight magnetic tuning. Note in FIGS. 19, 21, the central cylindrical high absorption region, while in FIGS. 20, 22 there is a more general uniform high absorption within the chamber.

Figure 10:
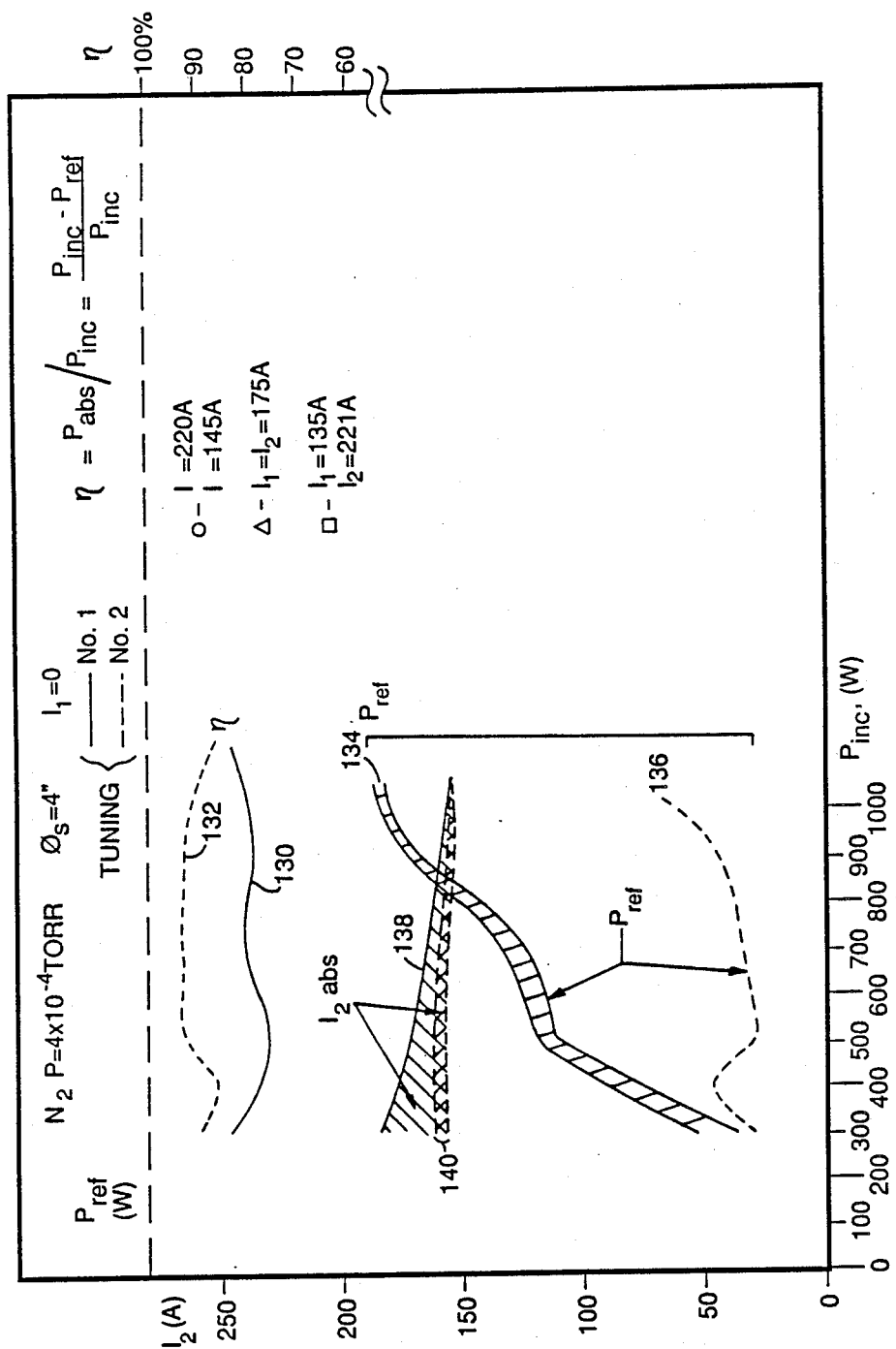
FIG. 10 is a graph illustrating the effect on absorption efficiency of different stub tuner adjustments.

Referring to FIG. 10, stub tuning from one setting (solid lines) to a second setting (broken lines) can make a substantial difference in the efficiency of absorption of the incident microwave power into the ECR plasma. For a range of incident power levels in a 4" source, the absorption efficiency (absorbed power divided by incident power) during high absorption at one stub tuner setting (curve 130) is substantially lower than for a second setting (curve 132). The difference in reflected power is shown by curves 134 and 136. Curves 138, 140 show that for relatively higher incident power levels the magnetic tuning is relatively insensitive to stub tuning.

Figure 11:
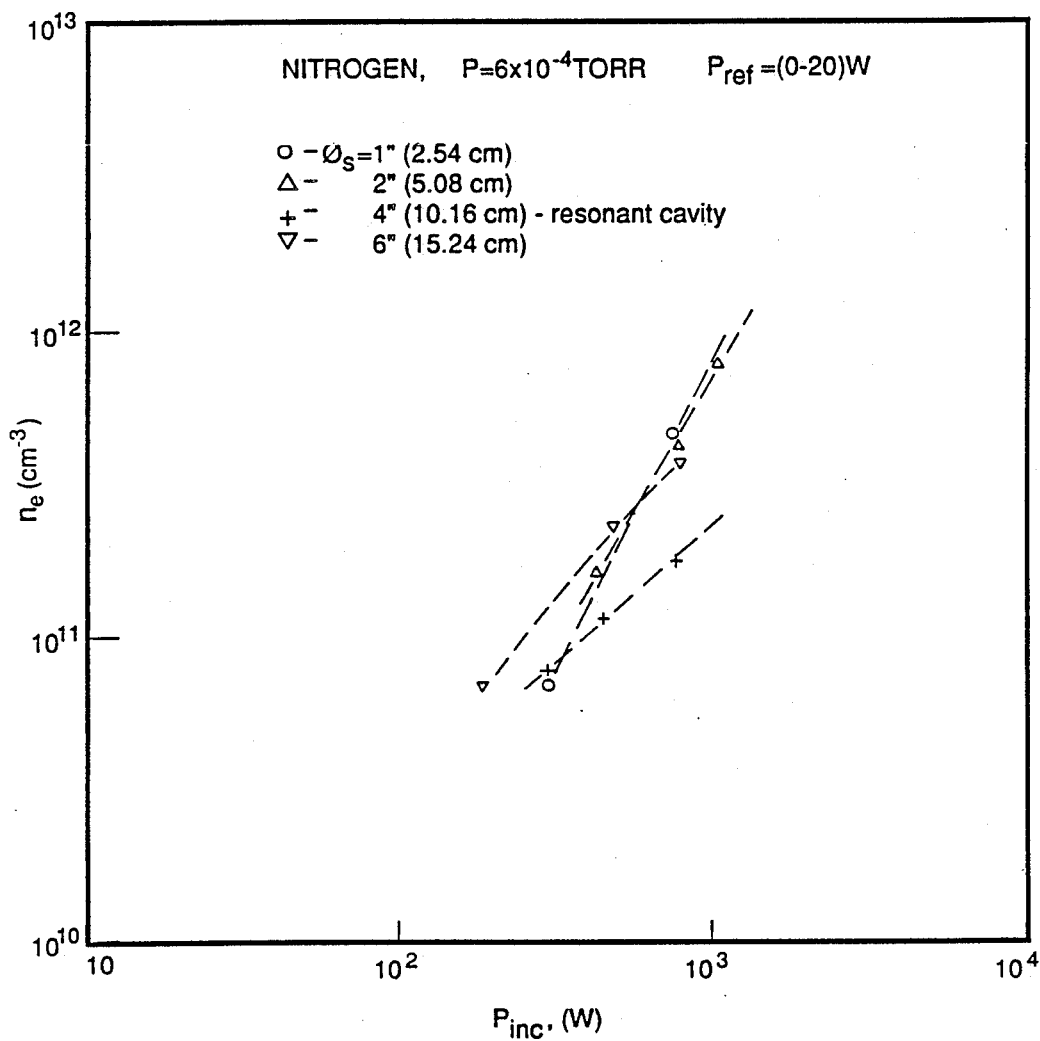
FIG. 11 is a graph of plasma density as a function of microwave power.

Referring to FIG. 11, for all size sources, plasma density increases gradually with the incident power, with no saturation in this relationship The plasma density reaches values of $7 \times 10^{11}$ cm$^{-3}$ (an order of magnitude higher than the critical density) at pressures of $2 - 6 \times 10^{-4}$ torr, which means that the degree of ionization exceeds 10 percent.

Figure 12:
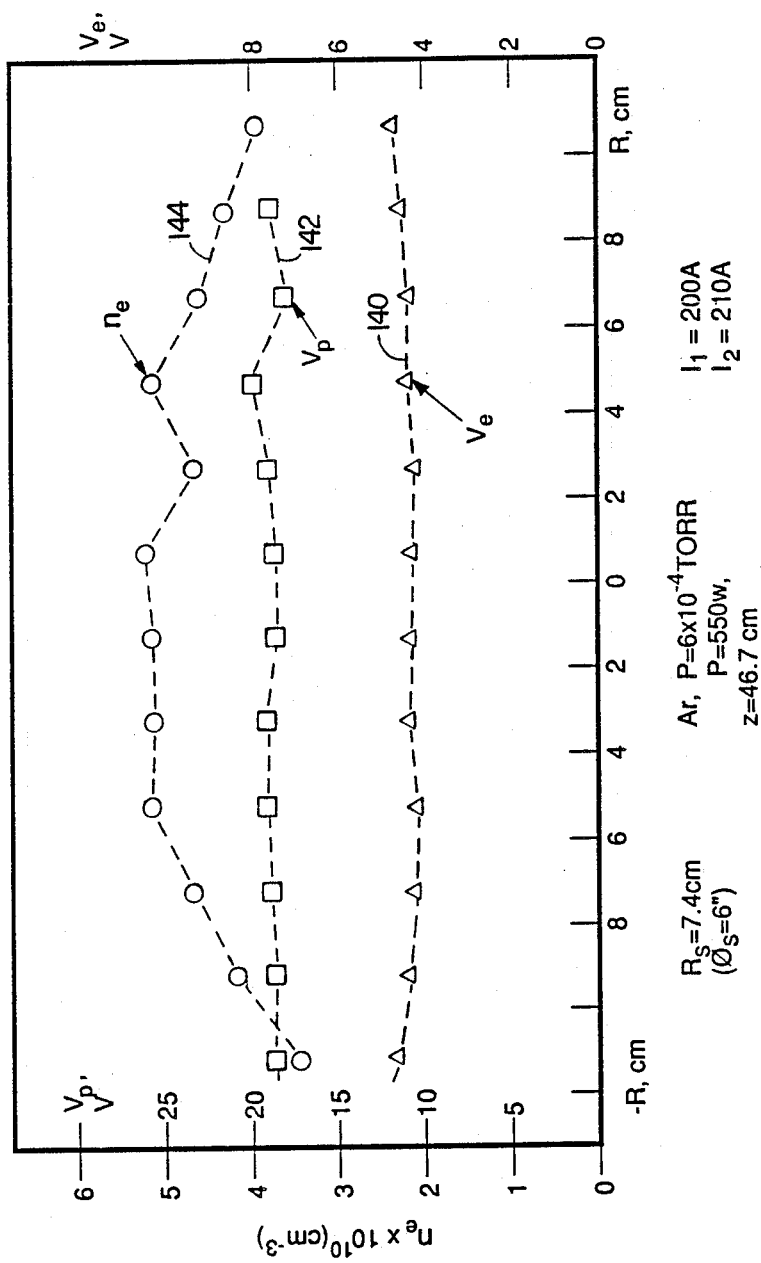
FIG. 12 is a graph illustrating the radial uniformity of the plasma in one mode of high absorption

FIG. 12 illustrates the radial distributions of electron temperature ($V_e$), plasma potential ($V_p$), and plasma density ($n_e$) (curves 140, 142, 144, respectively) for a 6" source at a distance of 46.7 cm from the vacuum window. They illustrate a good uniformity over 12 centimeters in diameter.

Figure 13:
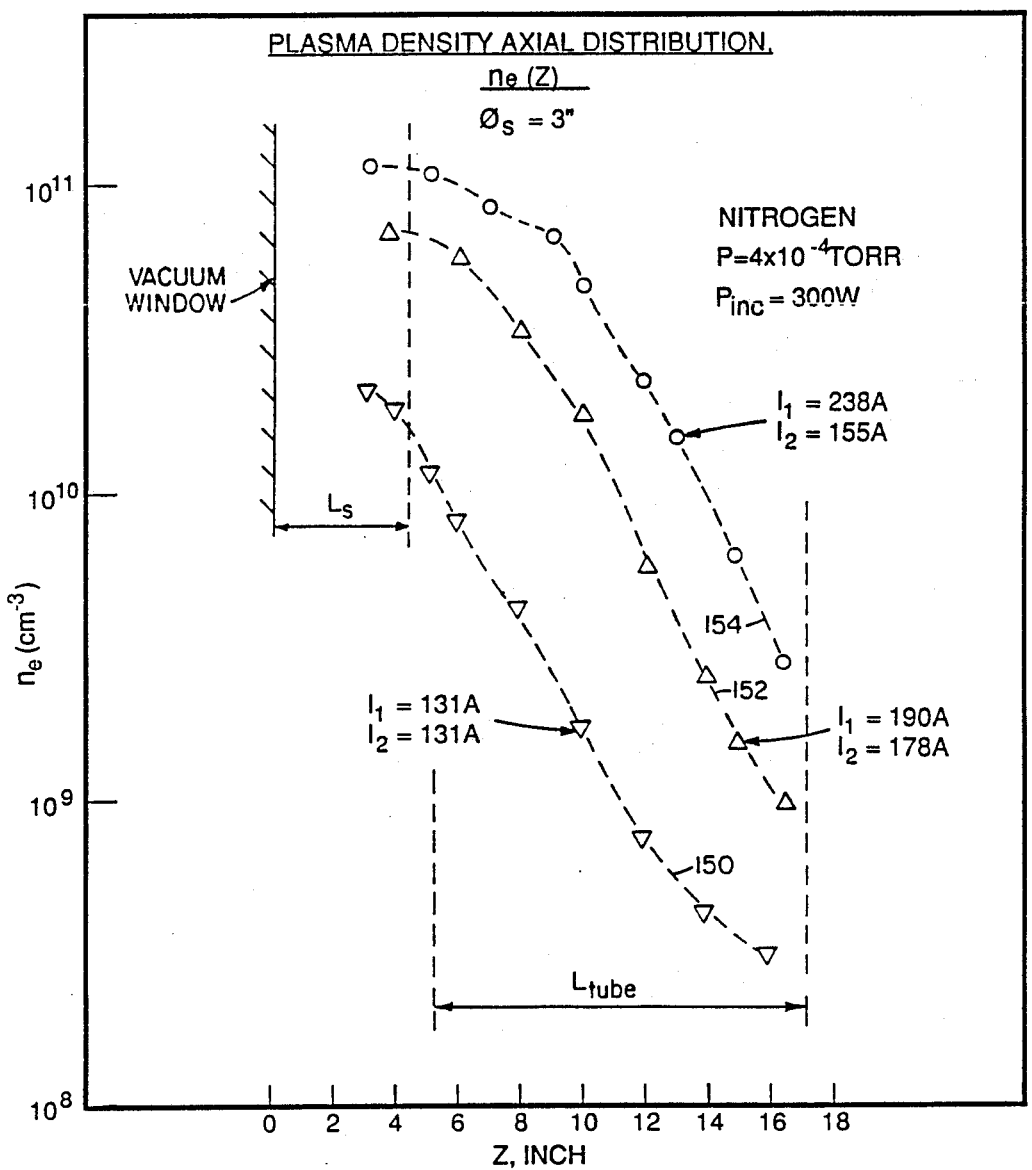
FIG. 13 is a graph illustrating the axial density distribution of the plasma stream beyond the end of the source chamber and within a conduit.

Referring to FIG. 13, the plasma density decreases, as expected, along the axis of the plasma source and tube, from axial positions within the chamber length $L_s$ to axial positions along the tube length $L_{tube}$. The three curves 150, 152, 154 correspond, respectively, to magnetic field tunings which achieve no high absorption, high absorption in the source chamber near the window, and hiqh absorption near the entrance of the tube. In FIG. 13, the tube diameter is 2" and the source diameter is 3".

The diameter and length of the tube affect the gradient of plasma density and potential approaching the sample. Therefore, by controlling the plasma potential gradient (which creates an acceleration field for the ions) one can control the ion energy. Tube diameter and length control the plasma density, and the shape of the plasma stream.

Figure 24:
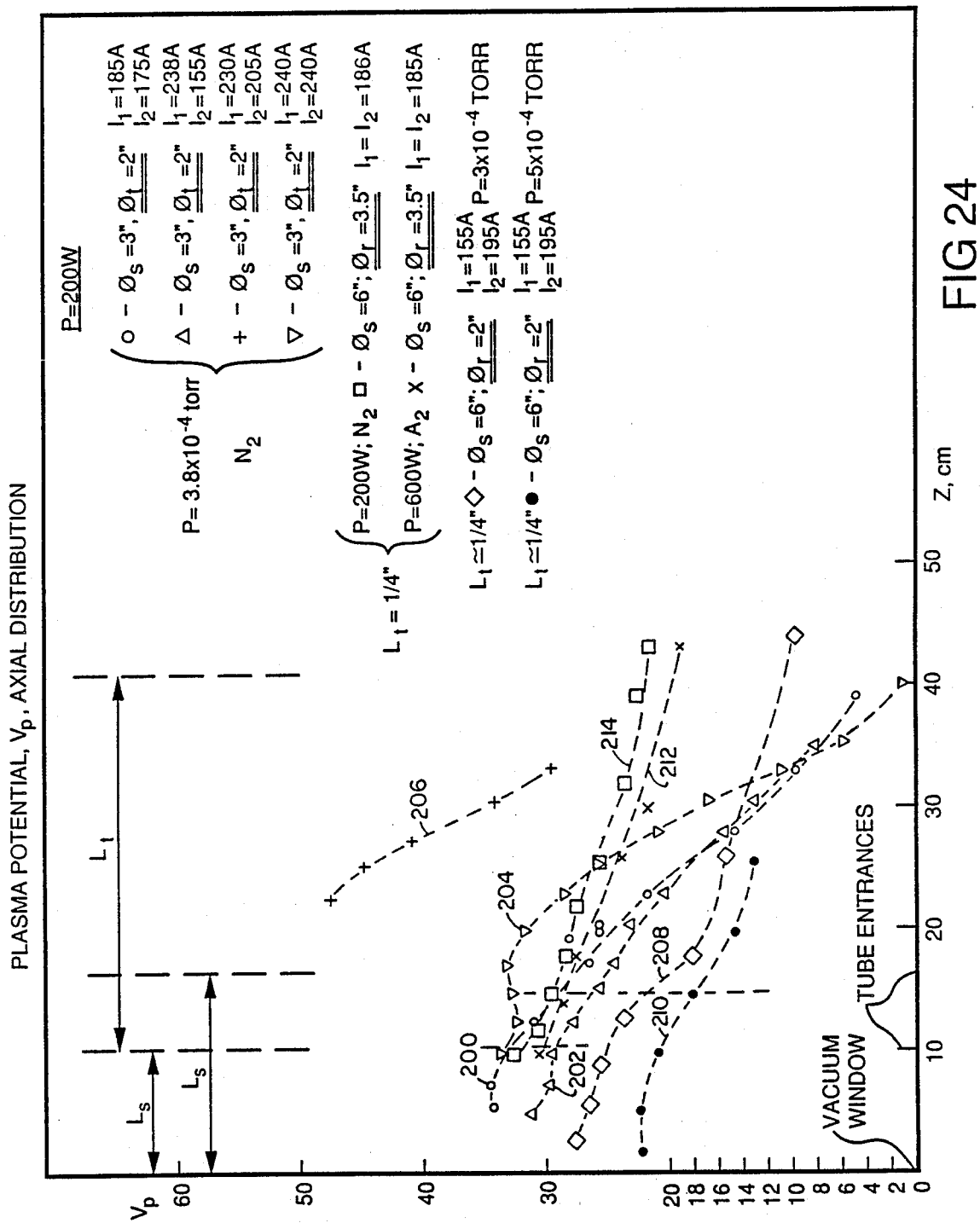
FIG. 24 is a graph showing the effect of conduit diameter on plasma potential gradient.

Referring to FIG. 24, curves 200, 202, 204, 206, show relatively sharp plasma potential gradients for a 2" diameter tube attached to a 3" source (curves 200, 202, 204, 206) and a 6" source (curves 208, 210) Curves 212, 214, on the other hand, are shallower for a 3.5" diameter ring ($L_r = \frac{1}{4}"$) tube on a 6" source. Also a 6" source with a 2" ring with $L_r = \frac{1}{4}"$ (curves 210) shows a drop near the ring but beyond the ring the plasma potential behaviors are the same as for curves 212, 214.

Figure 14:
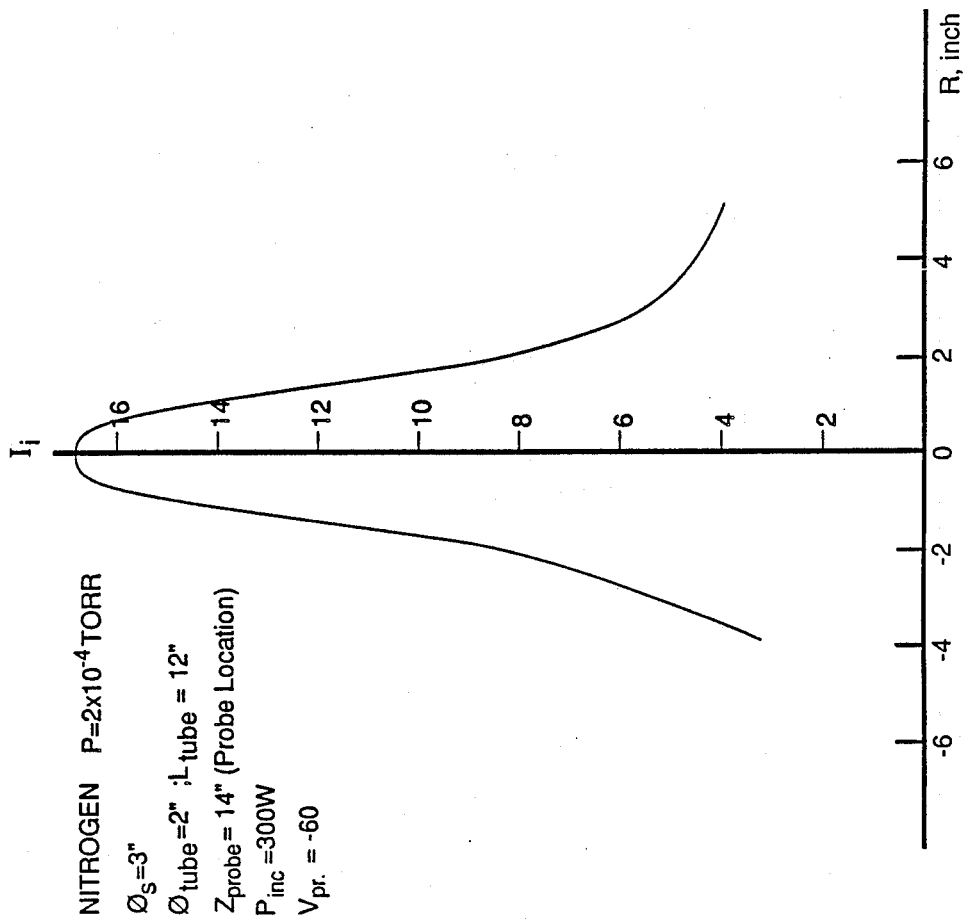
FIG. 14 is a graph illustrating the radial distribution of the plasma stream beyond the conduit.

Referring to FIG. 14, at a point 2" beyond the end of a 12" long, 2" diameter tube, the plasma density distribution is sharply centered on the axis, indicating that the plasma stream is well focused.

Figure 15:
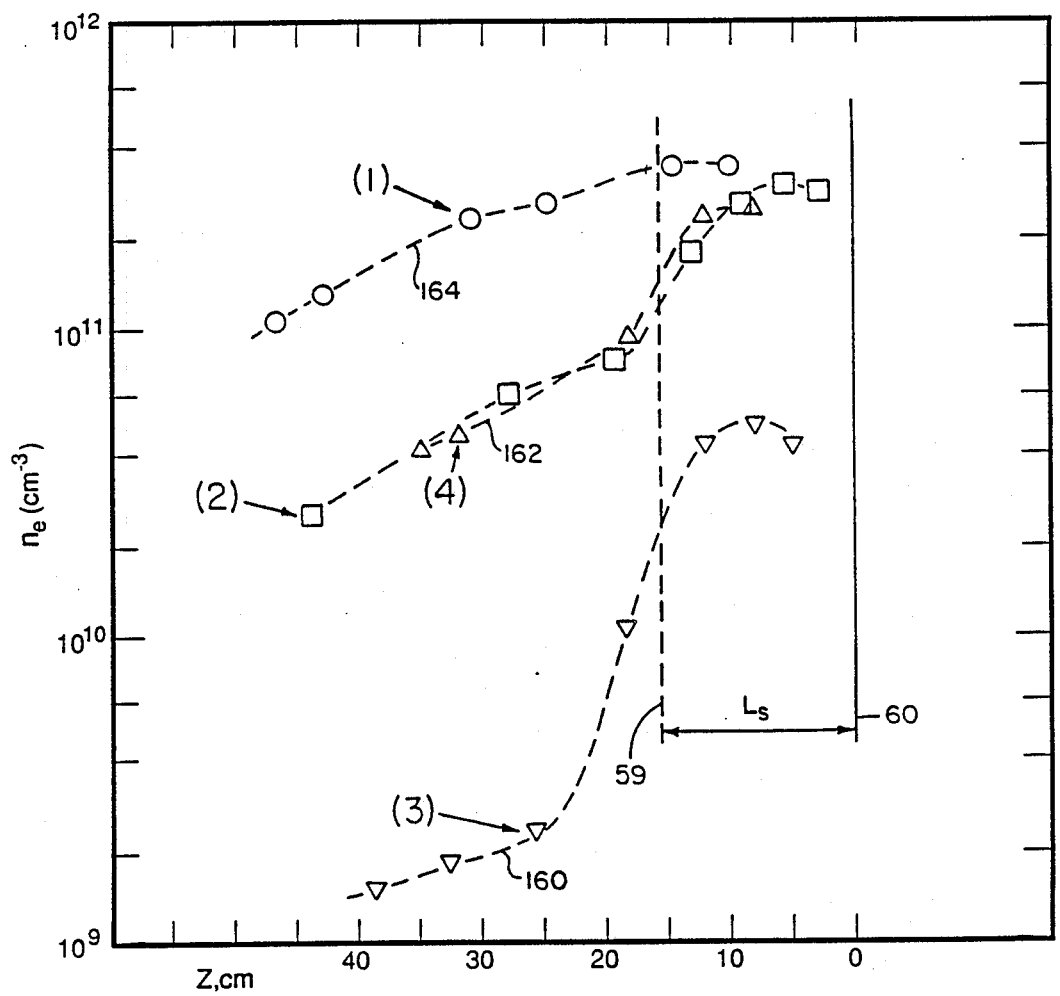
FIG. 15 is graph illustrating plasma stream density axial distribution for different modes of high absorption.

Referring to FIG. 15, plasma densities drop off more quickly at greater distances from the window for high absorption occurring in a donut shape in a 6" source (curve 160), than for a column shaped absorption region in a 6" source (curve 162) in both cases with a 2" diameter limiting ring. Curve 164 corresponds to a 6" source and a column shaped hiqh absorption region, with a 3.5" limiting ring.

In summary, by appropriate tuning of the magnetic field, the stub tuner, the incident power, the limiting ring diameter and length, and the gas pressure, the invention can control the mode and location in which high absorption occurs, can achieve uniform high density plasmas based on efficient microwave energy absorption, and can deliver a plasma stream at a required position with controlled properties and shape.

Figure 16:
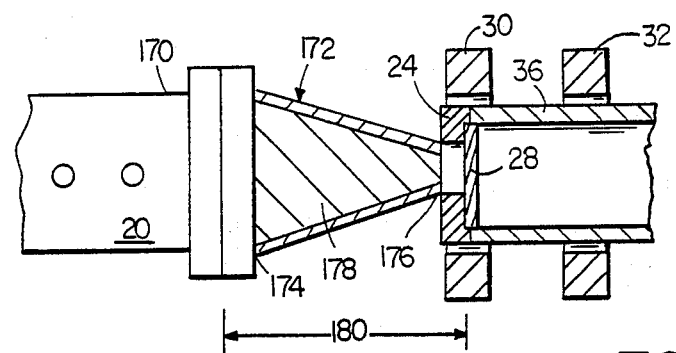
FIG. 16 is a side view, partially in cross section, of a conical dielectric coupler.
Figure 17:
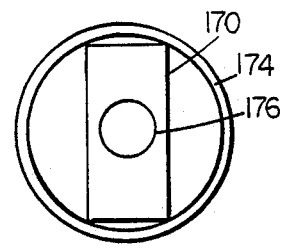
FIG. 17 is an end view of the coupler of FIG. 15 with the configuration of the output end of the stub tuner superimposed

Referring to FIGS. 16, 17 in cases where a small diameter source 36 is desirable, the magnets 30, 32, and window 28 would have to be unnecessarily large if it were required that they fit the relatively large rectangular output end 170 of stub tuner 20. In order to allow magnets 30, 32 and window 28 to be smaller, a conical dielectric coupler 172 may be inserted between end 170 and window 28. At its large end 174 coupler 172 is large enough to receive stub tuner end 170. At its small end 176, coupler 172 is small enough to feed the chamber via window 28. Coupler 172 is filled by a dielectric 178 (quartz, alumina, or boron nitride). The coupler serves as a waveguide to allow microwave power to propagate from the tuner via the vacuum window to a source with a size smaller than cutoff. The length 180 of the coupler is chosen to be an integral number of half-wavelengths of the microwaves. The relationship between the dielectric constant of the dielectric and the diameters of the two ends of the coupler is $\sqrt{\epsilon}=\phi_0/\phi_{68}$, where $\lambda_0$ is the input diameter and $\lambda_\epsilon$ is the output diameter $\phi_0 > 80\ 0$ and $\lambda_\epsilon$. The coupler is not under vacuum.

Other embodiments are within the following claims. For example, two windows may be used. The window may be boron nitride, or alumina, or another material. For each different window material an appropriate thickness is used, depending on the refractive index of the material, to provide the ¼ wavelength matching. For example, for a small source up to 4″, the window could be 4.96″ in diameter and 0.61″ thick.

I claim:

1. Apparatus for generating a plasma from a gas, comprising
    an evacuated chamber for receiving a volume of the gas,
    a microwave source connected to deliver microwave power, via a window of the chamber, and
    a magnetic field generator for establishing, within the chamber, a magnetic field to cause motion of electrons in the chamber to be resonant with a frequency of the microwave power,
    said evacuated chamber being of a dimension that is non-resonant with respect to propagation of the microwave power within the chamber in the absence of the plasma.

2. Apparatus for generating a plasma from a gas, comprising
    an evacuated chamber for receiving a volume of the gas,
    a microwave source connected by a waveguide to the chamber to deliver microwave power, via a window of the chamber, to initiate breakdown
    a magnetic field generator for establishing, within the chamber, a magnetic field to cause the motion of electrons in the chamber to be resonant with a frequency of the microwave power,
    the configuration of the waveguide and window being chosen with respect to a mode of propagation of the microwave power so that delivery of microwave power into the chamber and the breakdown both occur initially only in a region in the vicinity of the window.

3. The apparatus of claim 2 wherein the transmitted power ($P_t = P_{inc} - P_{ref}$, where $P_{inc}$ is the incident power and $P_{ref}$ is the reflected power) in initial breakdown is below 40 watts.

4. Apparatus for generating a plasma from a gas, comprising
    an evacuated chamber for receiving a volume of gas,
    a microwave source to deliver microwave power, via a waveguide to a window of the chamber, the waveguide being of larger cross-section than the chamber,
    a magnetic field generator for establishing, within the chamber, a magnetic field to cause the motion of electrons in the chamber to be resonant with a frequency of the microwave power, and
    a dielectric coupler, between the waveguide and the window, the coupler having a larger end for coupling to the waveguide, a smaller end for coupling to the window, and a dielectric material between the two ends, the ratio of the dimensions of the larger end, $\Phi_0$ to the smaller end, $\Phi_e$ being $\sqrt{e}$, where e is the dielectric constant of the dielectric material, every cross-sectional width of the larger end being larger than any cross-sectional width of the smaller end.

5. The apparatus of claim 4 in which the dielectric coupler is not within an evacuated region.

6. The apparatus of claim 4 in which the length of the dielectric coupler is exactly an integral number of half wavelengths of the microwave power.

7. The apparatus of claim 4 in which the window is supported in a flange and the magnetic field generator surrounds the chamber and is larger than the flange but smaller than the large end of the dielectric coupler.

8. The apparatus of claim 4 in which the dielectric coupler includes a metal outer wall.

9. Apparatus for generating a plasma from a gas, comprising
    an evacuated chamber for receiving a volume of the gas,
    a microwave source connected to deliver microwave energy to the chamber,
    a magnetic field generator for establishing, within the chamber, a magnetic field to cause motion of electrons in the chamber to be resonant with a frequency of the microwave power,
    the magnetic field generator comprising a pair of conductive current carrying coils coaxial with each other and with an axis of the chamber, the coils being spaced apart in a Helmholtz configuration,
    said evacuated chamber being of a dimension that is non-resonant with respect to propagation of the microwave power within the chamber in the absence of the plasma.

10. Apparatus for generating a plasma from a gas, comprising
    an evacuated chamber for receiving a volume of the gas,
    a microwave source connected by a waveguide to the chamber to deliver microwave energy, via a window of the chamber,
    a magnetic field generator for establishing, within the chamber, a magnetic field to cause motion of electrons in the chamber to be resonant with a frequency of the microwave power,
    the waveguide including a microwave multiple stub tuner for tuning the propagation of electromagnetic waves from the microwave source to the plasma within the chamber to control the location and shape of the region in which the plasma is formed.

11. Apparatus for generating a plasma from a gas, comprising
an evacuated chamber for receiving a volume of the gas,
a microwave source connected to deliver microwave energy to the chamber,
a magnetic field generator for establishing, within the chamber, a magnetic field to cause motion of the electrons to be resonant with a frequency of the microwave power, and
a conduit which delivers the plasma from an end of the chamber and is sized to be non-resonant with respect to propagation of the microwave power.

12. The apparatus of claim 11 in which the conduit is shorter than its width.

13. The apparatus of claim 11 in which the conduit is longer than its width.

14. The apparatus of claim 11 further comprising a second, separate magnetic field generator for generating a magnetic field within the conduit.

15. Apparatus for generating a plasma from a gas, comprising
introducing the gas into an evacuated chamber,
delivering microwave power, via a window of the chamber,
establishing, within the chamber, a magnetic field to cause the motion of electrons in the chamber to be resonant with a frequency of the microwave power, and
causing the evacuated chamber to have a dimension that is non-resonant with respect to propagation of the microwave power within the chamber in the absence of the plasma.

16. A method for generating a plasma from a gas, comprising
introducing the gas into an evacuated chamber,
delivering microwave power through a waveguide and via a window,
establishing, within the chamber, a magnetic field to cause the motion of electrons in the chamber to be resonant with a frequency of the microwave power,
the configuration of the waveguide and window being chosen with respect to a mode of propagation of the microwave power so that delivery of microwave power into the chamber and breakdown both occur initially only in a region in the vicinity of the window.

17. A method for generating a plasma from a gas, comprising
introducing the gas into an evacuated chamber,
delivering microwave power to the chamber,
establishing, within the chamber, a magnetic field to cause motion of electrons in the chamber to be resonant with a frequency of the microwave power, and
providing, as the magnetic field generator, a pair of conductive current carrying rings coaxial with each other and with an axis of the chamber, the rings being spaced apart in a Helmholtz configuration.

18. A method for generating a plasma from a gas, comprising
introducing the gas into an evacuated chamber,
delivering microwave power through a waveguide and via a window,
establishing, within the chamber, a magnetic field to cause the motion of electrons in the chamber to be resonant with a frequency of the microwave power, and
tuning a multiple stub microwave tuner in the waveguide to control the location and shape of the region in which the plasma is formed.

19. The method of claim 18 in which the microwave tuner is tuned to achieve a cylindrical plasma formation region centered on an axis of the chamber.

20. The method of claim 18 in which the microwave tuner is tuned to achieve a ring-shaped plasma formation region, centered on an axis of the chamber.

21. The method of claim 18 in which the microwave tuner is tuned to achieve a generally continuous plasma formation region across the width of the chamber.

22. The method of claim 18 in which the magnetic field generator is controlled to establish a predetermined magnetic field strength in the vicinity of the window.

23. Apparatus for generating a plasma from a gas, comprising
introducing the gas into an evacuated chamber,
delivering microwave power to the chamber,
establishing, within the chamber, a magnetic field to cause motion of electrons in the chamber to be resonant with a frequency of the microwave power, and
providing a conduit to form a path for delivery of the plasma from an end of the chamber said conduit being sized to have arbitrary dimensions with respect to propagation of the microwave power.

24. The method of claim 23 in which a microwave tuner associated with the delivery of microwave power to the chamber is adjusted to cause the formation of plasma within the conduit.

25. The method of claim 23 for delivering the plasma to a work surface in which the distance of the work surface to the end of the conduit is controllably adjusted to achieve a desired plasma density at the surface.

26. The apparatus of claim 1, 2, 9, 10, or 11 in which the magnetic field at the location of initial breakdown is 875 Gauss.

27. Apparatus for generating a plasma from a gas for delivery to a work surface comprising
an evacuated chamber for receiving a volume of the gas and delivering the plasma to the work surface,
a microwave source connected to deliver microwave power to the chamber, and
magnetic field generator for establishing within the chamber, a magnetic field to cause the motion of electrons in the chamber to be resonant with a frequency of the microwave power,
the chamber having an insulative lining whereby the plasma may be delivered free of current, enabling the work surface to be held at ground potential or floating potential without disturbing the plasma characteristics.

28. The apparatus of claim 1, 2, 9, 10, or 11 in which the magnetic field generator is movable along the length of the chamber.

29. The apparatus of claim 1, 2, 9, 10, or 11 in which the magnetic field generator is tunable to provide selectively uniform or gradient magnetic fields along the length of the chamber.

30. The apparatus of claims 1, 2, 9, 10, or 11 in which the chamber is smaller than 2" in diameter.

31. Apparatus for generating a plasma from a gas, comprising
introducing the gas into an evacuated chamber,
delivering microwave power to the chamber,
establishing, within the chamber, a magnetic field to cause the motion of electrons in the chamber to be resonant with a frequency of the microwave power, whereby a plasma is formed, and
controlling the magnetic field to cause the formation of the plasma with high absorption of microwave power within selectably either a columnar or ring-shaped region centered on an axis of the chamber.

32. The apparatus of claim 1 wherein said evacuated chamber is of a dimension smaller than the cutoff dimensions for propagation of the microwave power within the chamber in the absence of the plasma.

33. The method of claim 15 wherein the dimension of the evacuated chamber is smaller than the cutoff dimensions for propagation of the microwave power within the chamber in the absence of the plasma.

34. The apparatus of claim 4, 10, or 11 wherein said evacuated chamber is of a dimension that is non-resonant with respect to propagation of the microwave power within the chamber in the absence of the plasma.

35. The apparatus of claim 34 wherein said evacuated chamber is of a dimension smaller than the cutoff dimensions for propagation of the microwave power within the chamber in the absence of the plasma.

* * * * *

UNITED STATES PATENT AND TRADEMARK OFFICE
CERTIFICATE OF CORRECTION

PATENT NO. : 4,952,273

DATED : August 28, 1990

INVENTOR(S) : Popov

It is certified that error appears in the above-identified patent and that said Letters Patent is hereby corrected as shown below:

Column 5, line 15; "e.q.," should be --e.g.,--.

Column 8, line 34; "hiqh" should be --high--.

Column 8, line 50; "insert --208,-- before "210".

Column 8, line 63; "hiqh" should be --high--.

Column 9, line 1; "hiqh" should be --high--(2 times).

Column 9, line 24-25; delete "80 and" and insert --$\lambda o$ and $\phi\epsilon$>--.

Column 10, line 19; insert a space between "$\phi o$, and to" and also between "$\phi e$,and being".

Column 11, line 23; delete "Apparatus" and insert --A method--.

Signed and Sealed this

Twenty-fourth Day of November, 1992

Attest:

DOUGLAS B. COMER

Attesting Officer

Acting Commissioner of Patents and Trademarks